US009040890B2

(12) United States Patent
Fereyre et al.

(10) Patent No.: US 9,040,890 B2
(45) Date of Patent: *May 26, 2015

(54) ELECTRON-MULTIPLICATION IMAGE SENSOR

(75) Inventors: Pierre Fereyre, Voreppe (FR); Frédéric Mayer, Voiron (FR)

(73) Assignee: E2V Semiconductors, Saint-Égrève (FR)

( * ) Notice: Subject to any disclaimer, the term of this patent is extended or adjusted under 35 U.S.C. 154(b) by 513 days.

This patent is subject to a terminal disclaimer.

(21) Appl. No.: 13/427,826

(22) Filed: Mar. 22, 2012

(65) Prior Publication Data
US 2012/0292483 A1 Nov. 22, 2012

(30) Foreign Application Priority Data

Mar. 23, 2011 (FR) ...................................... 11 52413

(51) Int. Cl.
H01L 27/148 (2006.01)
H01L 27/146 (2006.01)
(Continued)

(52) U.S. Cl.
CPC .......... *H01L 27/14612* (2013.01); *H04N 5/351* (2013.01); *H04N 5/3745* (2013.01); *H01L 27/14603* (2013.01)

(58) Field of Classification Search
CPC H04N 5/3745; H01L 31/107; H01L 31/1075; H01L 27/14603; H01L 27/14612; H01L 27/14614; H01L 27/14643; H03N 3/155; H03N 3/1556

USPC ........ 250/208.1; 348/294, 302, 308; 257/290, 257/291, 292

See application file for complete search history.

(56) References Cited

U.S. PATENT DOCUMENTS

| 7,619,196 B2 * | 11/2009 | Oda ........................... 250/208.1 |
| 7,667,176 B2 * | 2/2010 | Olsen et al. ................ 250/208.1 |
| 7,671,391 B2 * | 3/2010 | Kawahito ..................... 257/290 |

(Continued)

FOREIGN PATENT DOCUMENTS

| EP | 2107610 A2 | 3/2009 |
| EP | 2071628 A1 | 6/2009 |

OTHER PUBLICATIONS

French Search Report for FR1152413, dated Nov. 8, 2011.

*Primary Examiner* — John Lee
(74) *Attorney, Agent, or Firm* — Lowe Hauptman & Ham, LLP

(57) ABSTRACT

This description relates to active-pixel image sensors. Each pixel includes, at the surface of a semiconductor active layer, a photodiode region, a charge storage node and a transfer structure for transferring charges from the photodiode to the storage node after a charge integration time for charges generated by the light in the photodiode. The transfer structure includes a first transfer gate adjacent to the photodiode, a second transfer gate adjacent to the storage node, and an electron-multiplication amplifying structure located between the first and second transfer gates. The amplifying structure includes two separate accelerating gates and an intermediate diode region at a fixed surface potential, located between the two accelerating gates. A succession of alternating high and low potentials is applied to the accelerating gates while the charges are in transit in the transfer structure, before they are transferred to the storage node.

9 Claims, 4 Drawing Sheets

(51) Int. Cl.
*H04N 5/351* (2011.01)
*H04N 5/3745* (2011.01)

(56) References Cited

U.S. PATENT DOCUMENTS

| | | | |
|---|---|---|---|
| 7,821,042 B2* | 10/2010 | Nakashima et al. | 257/217 |
| 7,834,304 B2* | 11/2010 | Oda | 250/208.1 |
| 7,952,121 B2* | 5/2011 | Arimoto et al. | 257/252 |
| 8,436,927 B2* | 5/2013 | Egawa | 348/308 |
| 8,592,740 B2* | 11/2013 | Mayer | 250/208.1 |
| 8,692,175 B2* | 4/2014 | Fereyre et al. | 250/207 |
| 2007/0158770 A1* | 7/2007 | Kawahito | 257/431 |
| 2007/0176213 A1* | 8/2007 | Oda | 257/247 |
| 2008/0048212 A1* | 2/2008 | Nakashima et al. | 257/222 |
| 2008/0179490 A1* | 7/2008 | Ohno et al. | 250/201.1 |
| 2008/0179495 A1 | 7/2008 | Shimizu et al. | |
| 2009/0144354 A1* | 6/2009 | Misawa et al. | 708/838 |
| 2009/0152605 A1* | 6/2009 | Ohno et al. | 257/294 |
| 2009/0167910 A1 | 7/2009 | Carriere | |
| 2009/0251582 A1 | 10/2009 | Oike | |
| 2009/0284632 A1 | 11/2009 | Onuki et al. | |
| 2011/0234876 A1* | 9/2011 | Leconte | 348/308 |
| 2011/0303822 A1* | 12/2011 | Mayer | 250/208.1 |
| 2012/0241595 A1* | 9/2012 | Fereyre et al. | 250/208.1 |
| 2012/0292483 A1* | 11/2012 | Fereyre et al. | 250/208.1 |

\* cited by examiner

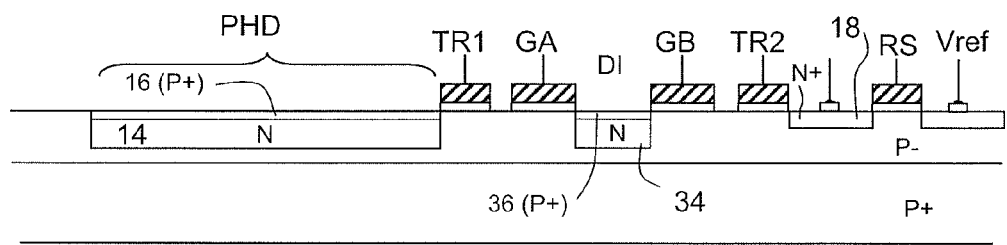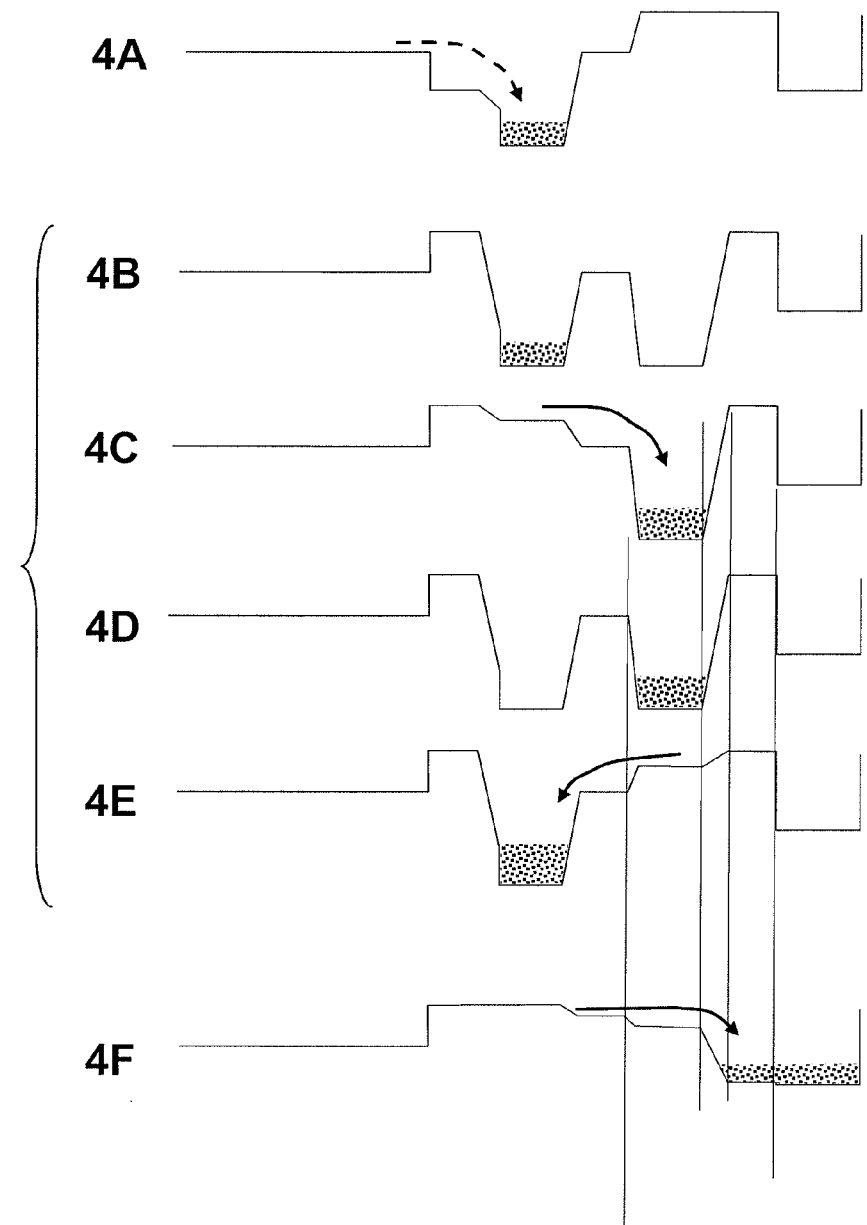
Fig. 4

ELECTRON-MULTIPLICATION IMAGE SENSOR

RELATED APPLICATIONS

The present application is based on, and claims priority from, French Application Number 1152413, filed Mar. 23, 2011, the disclosure of which is hereby incorporated by reference herein in its entirety.

FIELD OF THE INVENTION

The invention relates to image sensors, and more particularly those that are intended to collect images at low luminance levels and optionally also high luminance levels.

BACKGROUND OF THE INVENTION

When the light level is low, the pixels of a matrix image sensor collect few electrons. It is necessary to greatly increase the integration time in order to obtain an image, but this is to the detriment of the signal-to-noise ratio.

In CCD (charge-coupled device) technology, it has already been proposed to incorporate, in a sensor, electron multiplication systems that create additional electrons from the electrons naturally generated by the light. The electrical signal which is then received is therefore multiplied by a factor. The noise also increases, but in a lower ratio than the signal.

These electron multiplication principles in CCD technology consist in increasing the potential differences present between the charge transfer gates, thereby accelerating the electrons during transfer. The energy imparted thereto is sufficient for the collisions with the atoms of the semiconductor material to make electrons in these atoms pass from the valence band to the conduction band. These electrons create electron-hole pairs, which charge carriers are themselves accelerated and may give rise to further collisions. The result is an electron multiplication phenomenon.

This phenomenon can occur in CCD sensors since the electrons are transferred from gate to gate and it is the increase in voltage on certain gates that enables the electrons to be greatly accelerated in order to cause this multiplication.

However, in active-pixel sensors, which comprise within each pixel a charge-voltage conversion circuit (a few transistors), multiplication is not possible since the electron packets are voltage-converted immediately after each integration period. The electrons are not transferred from gate to gate. However, active-pixel sensors have already been proposed that use a multi-gate multiplication stage between a photodiode and a charge storage node, within the pixel. However, this stage generates losses due notably to the poor quality of charge transfer in the multiplication gates, except if these gates are mutually overlapping, but then this requires the use of a more costly technology having at least two levels of gates.

SUMMARY OF THE INVENTION

The invention proposes an image sensor that uses active pixels and that nevertheless allows electron multiplication for the purpose of providing satisfactory images even when there is a very low light level. This sensor does not use two levels of gates.

The sensor is formed in a semiconductor substrate, each pixel comprising, at the surface of a semiconductor active layer, a photodiode region, a charge storage node, a read transistor for reading the charges stored in the storage node, a reset transistor for resetting the potential of the storage node, and a transfer structure for transferring charges from the photodiode to the storage node after a charge integration time for charges generated by the light in the photodiode, characterized in that the transfer structure comprises a first transfer gate adjacent to the photodiode, a second transfer gate adjacent to the storage node, and an amplifying structure located between the first and second transfer gates and comprising two separate accelerating gates, an intermediate diode region at a fixed surface potential located between the two accelerating gates, means for firstly applying to the first transfer gate a first transfer pulse for charge transfer from the transfer gate to at least one first accelerating gate, means for then applying to the accelerating gates a succession of alternating high and low potentials for successive charge transfer from one accelerating gate to the other through the intermediate diode region, and means for then applying to the second transfer gate a second transfer pulse for charge transfer from the accelerating gates to the storage node.

The intermediate diode region is preferably what is called a "pinned" diode, that is to say a diode having a fixed surface potential with respect to a reference potential. The fixed surface potential is obtained by placing the upper part of the diode in direct contact with a semiconductor region at the potential of the substrate. The alternations of opposed potentials are then gate potentials (a high potential and a low potential) such that the potential beneath the gate alternates between a higher level and a lower level than the fixed surface potential.

Throughout the following, it will be considered that the charges generated by the light and stored, to be measured by the pixels, are electrons, and consequently the higher potential create potential wells capable of collecting charges, whereas the lower potentials create potential barriers that prevent charge transfer. It would be conceivable for the stored charges to be holes rather than electrons. The principle would be the same, but it would be necessary to reverse the potentials and the types of conductivity of the semiconductor regions. The invention will be described solely in the context of electron storage.

The semiconductor substrate includes a P$^-$-type semiconductor active layer which is maintained at a reference potential. The intermediate diode includes an N-type diffused region in said layer, and this region is covered by a P-type surface region that is connected to the potential of the active layer. Preferably, the photodiode is also a pinned photodiode formed by an N-type diffusion covered by a P-type region raised to the potential of the active layer (the doping levels not necessarily being the same for both the intermediate diode and the photodiode). The transfer gates and the accelerating gates are gates insulated from the P-type active layer by a thin insulating layer. The intermediate diode region may be covered by an insulating layer.

Preferably, the first transfer gate is separated from the first accelerating gate by as short a distance as possible and in any case shorter than the distance between the two accelerating gates. Likewise, the second transfer gate is separated from the second accelerating gate by as short a distance as possible and shorter than the distance between the two accelerating gates.

The sensor may operate either in non-amplification mode or in amplification mode or else in hybrid mode, the hybrid mode allowing a very large dynamic range to be achieved both as regards very low levels of illumination and very high levels of illumination.

In non-amplification mode, no succession of alternating multiples of high and low potentials is applied to the accelerating gates. The first transfer pulse transfers the charges from the photodiode to the accelerating gates, and the second transfer pulse transfers the charges from the accelerating gates to the storage node.

In amplification mode, a succession of alternating opposed potentials is applied to the gates between the first and second transfer pulses.

In hybrid mode, it is possible to provide for every other image frame to undergo amplification by a succession of alternating potentials on the accelerating gates with a first amplification factor and for the remaining frames to undergo amplification with a second amplification factor (or not to undergo any amplification: factor equal to 1). The subsequent image processing for each pixel will use the measurement coming from one or other of the frames according to an image or pixel illumination criterion.

Alternatively, another solution for operating in hybrid mode may also be provided: the measurement with the two multiplication factors is carried out over the course of one and the same frame by splitting the integration time into two parts over the course of the frame, the first measurement resulting from a first integration time and the second measurement resulting from a second integration time. The sensor then includes means for carrying out the following groups of operations:

a first electron transfer from the photodiode to the amplifying structure at the end of the first integration time, a multiplication with a first multiplication factor in the amplifying structure, a resetting of the potential of the storage node and a subsequent sampling of this potential in the read circuit, a first electron transfer from the amplifying structure to the storage node after multiplication by the first multiplication factor, and a sampling of the potential of the storage node after this transfer;

after the first transfer from the amplifying structure to the storage node, a second electron transfer from the photodiode to the amplifying structure at the end of the second integration time, a multiplication by a second factor, a second charge transfer from the amplifying structure to the storage node, and a sampling of the potential of the storage node; and an analogue-digital conversion of at least one difference between a sample taken after an electron transfer to the storage node and a sample taken between the resetting of the storage node and this transfer.

The two integration times are preferably different, the shorter time corresponding preferably to the smaller multiplication factor.

In one embodiment, provision is made for the first accelerating gates of a given row of pixels (or alternatively a given column) are all connected together, and the second accelerating gates of a given column (or alternatively a given row) are all connected together. The columns and the rows of gates are addressable so that it is possible to perform an amplification by alternating gate potentials in a region of interest of the sensor by selecting the rows and columns corresponding to this region of interest. The pixels that do not belong both to such a row and such a column do not undergo electron amplification as they do not experience an alternation of opposed potentials on their two accelerating gates, although one of the gates does undergo an alternation of potentials.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein:

FIG. 4 shows a diagram of the potentials in the semiconductor during the various operating steps;

DESCRIPTION OF PREFERRED EMBODIMENTS

Figure 1:
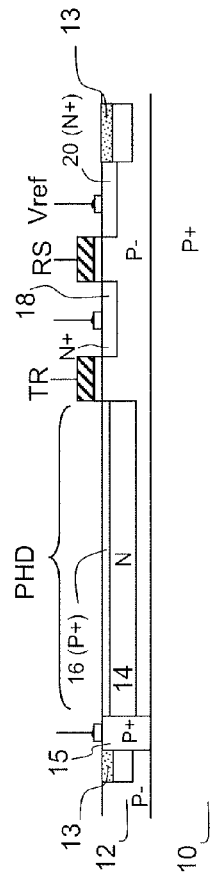
FIG. 1 shows, in vertical cross section, the overall structure of a pixel of an active-pixel image sensor.

FIG. 1 shows the main elements of a conventional active pixel in CMOS technology. The pixel is formed in a substrate that preferably includes a lightly doped semiconductor active layer 12 of $P^-$ type (the symbol $P^-$ is used to denote this light doping) formed on the surface of a more heavily doped layer ($P^+$). The pixel is isolated from the neighbouring pixels by an isolating barrier 13 that completely surrounds it. This barrier may be a surface isolating trench above a P-type well.

The pixel includes a photodiode region PHD, the perimeter of which follows the outline of an N-type semiconductor region implanted in part of the depth of the active layer 12. This implanted region is surmounted by a surface region 16 of $P^+$ type, which is maintained at a zero reference potential. The photodiode is said to be "pinned" (the surface potential of the $P^+$ surface region being fixed). The zero reference potential is that applied to the $P^-$ active layer. In the simplest case, this is the potential of the $P^+$ type substrate lying beneath the active layer and applying its own potential to the active layer. The surface region 16 is maintained at this zero potential for example by the fact that the region 16 touches a deep diffusion zone 15 of $P^+$ type that rejoins the substrate 10. An electrical contact may also be provided on this diffusion zone 15 to apply a zero potential to the region 16 by this contact.

A charge storage node or charge storage region 18 is provided away from the photodiode region PHD and is separated therefrom by an insulated gate TR that serves to permit or prevent the transfer of charge stored in the photodiode to the storage node.

The charge storage node 18 is an N-type diffusion zone in the active layer 12. A contact is formed on the storage node to allow the potential of this region to be applied on the gate of a follower transistor (not shown) so as to convert the amount of charge contained in the storage node into an electrical voltage level.

Another gate RS, called a resetting gate, serves to empty the charges from the storage node into a discharge drain 20 which is a region of $N^+$ type connected to a positive resetting potential Vref.

To simplify matters, the drawing does not show elements that may be conventionally present in the pixel and especially a follower transistor, for copying over the potential of the storage node 18, and a row select transistor, in the case of a matrix of a number of rows of pixels, to enable the source of the follower transistor to be connected to a column conductor of the matrix. These elements are in any case located outside the isolating region 13 that surrounds the photodiode. Likewise not shown in the cross section of FIG. 1 is a gate for resetting the potential of the photodiode PHD. This gate is used to discharge into a drain (not shown) the photodiode charges at the start of an integration period.

The pixel operates in general as follows: the illumination of the photodiode region PHD over an integration time T generates electrical charges (electrons in the present case, but these could be holes if all the conductivity types and the signs of the applied potential differences are reversed). These charges are stored in the N region of the photodiode. Before the end of time T, the potential of the storage node is reset to Vref by the resetting gate RS. At the end of the time T, a transfer pulse is applied to the gate TR and the charges stored in the photodiode are discharged into the storage node. The potential of the storage node is transmitted to the follower transistor (not shown), while a new integration period starts.

According to the invention, an electron-multiplication structure having two accelerating gates may be incorporated into the transfer structure, enabling charges to be transferred from the photodiode to the storage node 18.

Figure 2:
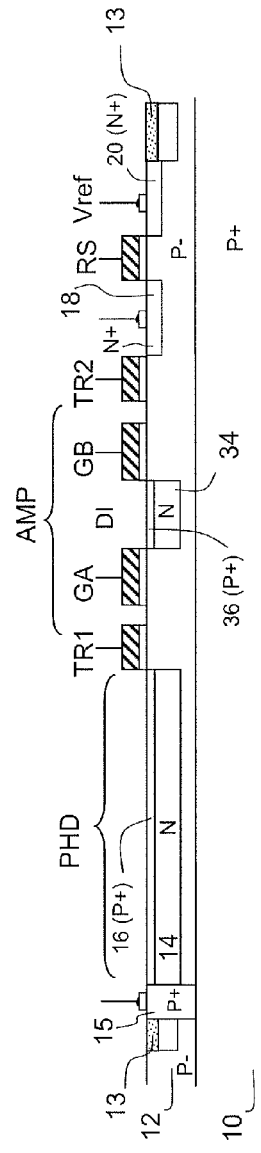
FIG. 2 shows in vertical cross section the structure of a modified pixel according to the invention.
Figure 3:
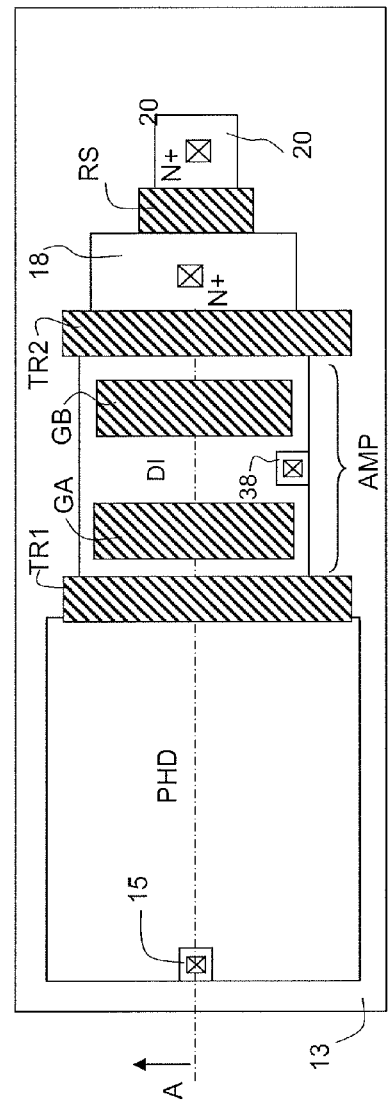
FIG. 3 shows a top view of the pixel.

The resulting pixel structure is shown in cross section in FIG. 2 and from above in FIG. 3.

Firstly, the transfer gate is now split into two transfer gates, which are an upstream transfer gate TR1 and a downstream transfer gate TR2.

Secondly, placed between the transfer gates TR1 and TR2 is an amplifying structure AMP that comprises two accelerating gates GA and GB separated by a gap. This gap is occupied by an intermediate diode region DI, this region constituting a pinned diode, like the photodiode. It therefore consists, like the photodiode (but not necessarily with the same doping levels) of a diffused region 34 of N type in the active layer 12, this region being covered by a surface region 36 of $P^+$ type. This region 36 is maintained at the zero reference potential for example by the fact that it touches, although not visible in FIG. 2, a deep region 38 of $P^+$ type that rejoins the substrate, similar to the region 15 that touches the region 16 of the photodiode.

The accelerating gate GA is an insulated gate, like the transfer gates. It is separated from the first upstream first transfer gate TR1 by a narrow gap (as narrow as possible depending on the technology used) which need not be doped, that is to say it may be formed directly by the layer 12. Likewise, the accelerating gate GB is separated from the second transfer gate TR2 by a gap that is as narrow as possible.

The transfer structure (gates TR1 and TR2, gates GA and GB and intermediate diode region) is preferably masked from light by an absorbent or reflective opaque layer, which is not shown in the figures.

Potential switching means are provided for applying, directly to the accelerating gates GA and GB, high or low potentials depending on the transfer or amplification phase in question. These switching means are not shown as they do not lie in the pixel.

FIG. 4 shows the diagrams for the potentials in the active layer 12, these explaining the operating principle of the sensor. The cross section through the sensor has been transferred to the top of the figure in order to show the places where the wells and potential barriers are located during the various steps shown schematically by the lines 4A to 4F. The potentials are conventionally represented as increasing downwards.

The line 4A shows the potentials at the end of a charge integration step, at the moment of charge transfer from the photodiode PHD to the amplifying structure. This transfer is controlled by the gate TR1, by lowering the potential barrier beneath this gate. The charges are discharged beneath the gate GA raised at this moment to a high potential. The gate GB is at the low potential, but could also be at the high potential. The intermediate diode D1 is at the built-in potential set by holding the region 36 at the reference potential of the active layer 12, which here is that of the substrate 10. The built-in potential of the intermediate diode may be slightly different from the built-in potential of the photodiode.

After this first transfer, a charge amplification phase takes place. This phase comprises a multiplicity (several tens, hundreds or even thousands) of alternating potentials indicated by the lines 4B to 4F. The charges confined beneath the gate GA are firstly switched towards the gate GB (steps 4B and 4C) and then again towards the gate GA (steps 4D and 4E). The switching takes place with potentials that establish a high electric field. Under the effect of the charge carrier acceleration, electron-hole pairs, and therefore additional electrons, are generated at each switch. The gain during a switch is very low, but it is multiplied by the number of switches. The series of steps 4B to 4E is repeated N times in order to obtain the desired final amplification factor. Of course, the number N depends on potentials applied to the gates GA and GB, since the electric fields depend on these potentials, and the number of electrons created per impact during an electric field application step depends on the electric field exerted on the transiting electrons.

More precisely,
In step 4B, the potential barrier beneath the gate GB is lowered and a potential well is created beneath this gate, GA remaining at the high potential;
In step 4C, the potential of the gate GA is decreased, thereby switching the charges from the gate GA to the gate GB;
In step 4D, a potential well is created beneath the gate GA; and
In step 4E, the potential of the gate GB is decreased, the charges being discharged from the gate GB to the gate GA.

The gates GA and GB therefore experience an alternation of opposed electric fields, the potential of one of the gates creating, beneath this gate, a potential barrier higher than the built-in potential of the intermediate diode DI, and the potential beneath the other gate creating, beneath this gate, a potential well deeper than the built-in potential of the intermediate diode.

After N series of alternations, the process stops at step 4C, and charge is transferred from beneath the transfer gate to the storage node 18.

Step 4F represents this final transfer: the potential of the gate GA is decreased (while the potential of the gate GB remains high) and the potential of the transfer gate TR2 is increased (while that of the gate TR1 is low and remains low). The charges present beneath the gate GB are discharged into the storage node and concentrate in this node when the transfer gate TR2 is shut off by lowering its potential.

The width of the intermediate diode DI, that is to say the distance between the accelerating gates, is large enough for the potential in the semiconductor to remain fixed at least at the centre of the diode. If the gap were to be too narrow, the potential would experience the influence of the adjacent gates.

The intermediate diode region at no time serves to store charges, unlike the regions located beneath the accelerating gates. The intermediate diode region is a transit region for the charges that move from the region beneath the gate GA to the region beneath the gate GB.

The $P^+$ region 36 may be covered by a thin insulating layer. This insulating layer is not degraded by the electrons accelerated from one gate to the other, since the transit takes place within the volume beneath the region 36 and not on the surface.

Various possible modes of operation of this image sensor structure will now be described.

In general, the pixel forms part of a matrix of pixels in the form of rows and columns, the pixels of any one row being addressed by a row conductor and the outputs of the pixels of any column being connected to a column conductor. A double-sampling read circuit is placed at the foot of a column and serves to sample the potentials that appear on the column conductor upon selecting a row of pixels. The potential appearing on the column conductor corresponds to the potential of the storage node, which may be a reset potential or a useful signal potential corresponding to the illumination of the pixel selected. The read circuit samples and stores in memory a reset potential and a useful potential. It determines the difference therebetween and converts the difference into a digital signal.

Figure 5:
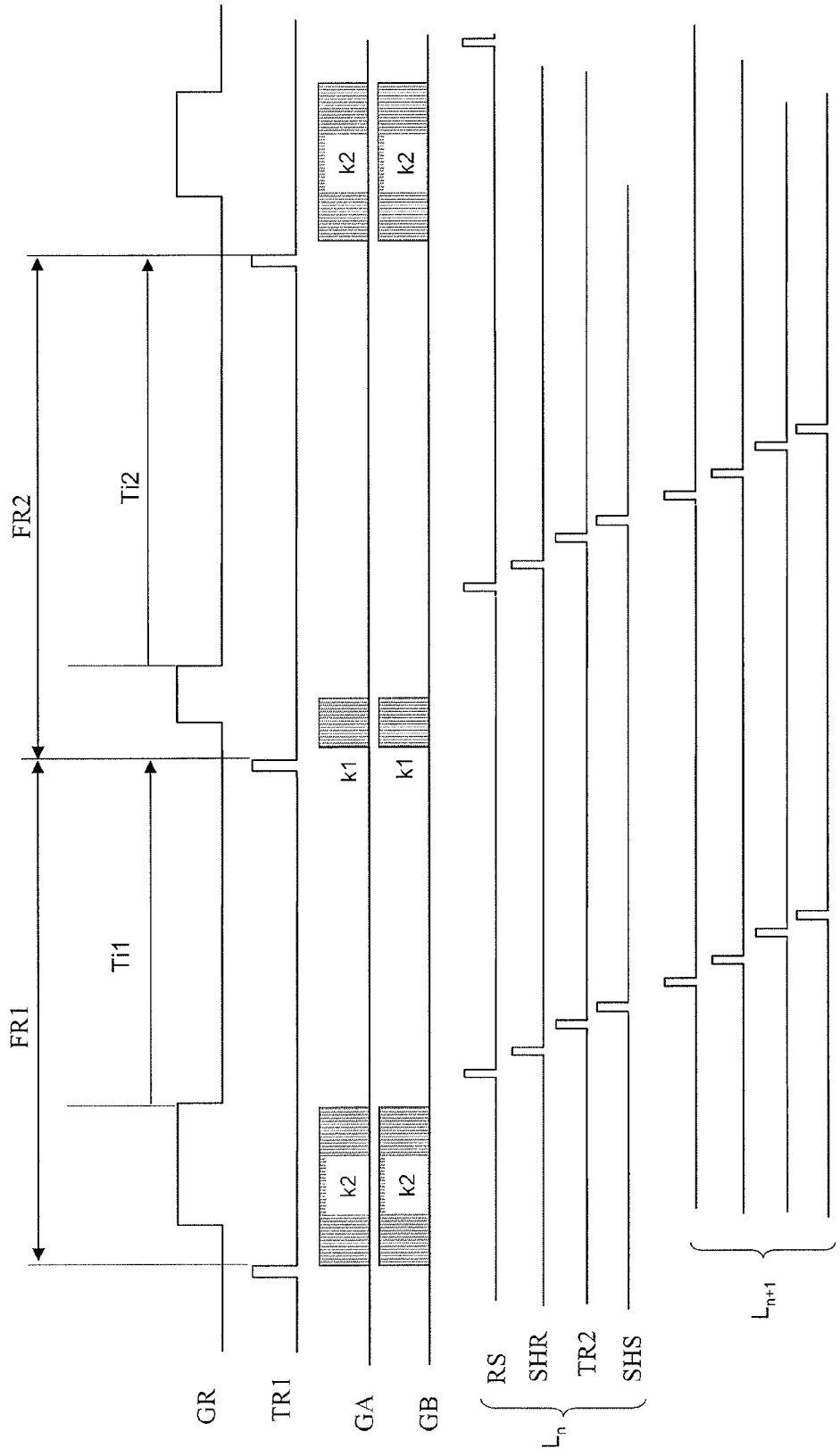
FIG. 5 shows a timing diagram for the operation of the sensor with a low luminance level.

The timing diagram in FIG. 5 shows one operating mode of the sensor with a low light level, for example for night time viewing.

Two successive frames FR1 and FR2 are shown in FIG. 5.

The signal GR represents the resetting of the potential of the photodiode at the start of a frame, which is general for all the pixels, carried out for example by opening the resetting gate of the abovementioned photodiode.

The signal RS represents a pulse for resetting the potential of the storage node. This signal is transmitted in succession for each row at the moment of reading.

The sampling signals at the foot of a column are denoted by SHR (sampling a storage node reset level) and by SHS (sampling of a storage node useful level after the charges amplified by the amplifying structure have been discharged into this node). These signals are transmitted in succession row by row during the reading operation.

The lines TR1 and TR2 represent the pulses applied to the gates TR1 and TR2 respectively. The signal TR1 is applied generally for all the pixels, while the signal TR2 is transmitted row by row.

The lines GA and GB show the periods during which multiple alternations of high and low potentials are applied to the gates GA and GB of the amplifying structure. These potentials are applied to all those pixels of the matrix for which an amplification is desired (for example all the pixels of the matrix or all the pixels of a region of interest).

The sequence of steps for the frame FR1 is the following:
resetting of the photodiode by the signal GR, the end of this resetting step constituting the start of an integration period for all the pixels; the end of the signal GR determines the start of a charge integration time Ti1; the longer the signal GR, the shorter the integration time if it is considered that the total (constant) period of a periodic frame comprises firstly a general reset time followed by an integration time Ti1;
charge integration in the photodiode; and
opening of the first transfer gate TR1 for all the pixels, emptying the charges from the photodiode beneath the gate GA of the amplifying structure at the end of the integration time Ti1, it being the end of opening of the gate TR1 that determines the end of the time Ti1.

After this, the charge integration of the next frame FR2 starts, but the processing of the signals arising from the first frame continues by amplification in the amplifying structure by applying an alternation of potentials on the gates GA and GB; the number of alternations is chosen so as to multiply the number of electrons by a first multiplication factor k1.

Next, the following operations are carried out in succession row by row (a row $L_n$ is represented, while a following row $L_{n+1}$ is mentioned):
resetting of the potential of the storage node 18 (signal RS);
sampling of the reset potential level of the storage node by the sampling circuit placed at the foot of a column (signal SHR for the row in question);
charge transfer from the gate GB to the storage node via the second transfer gate TR2 for the row in question;
sampling of the potential of the storage node of the pixels of the row in question by the sampling circuit at the foot of a column (signal SHS for the row in question); and
analogue-digital conversion of the difference between the two samples.

The four consecutive signals RS, SHR, TR2 and SHS and the analogue-digital conversion are repeated for each row while charge integration of the second frame FR2 takes place.

The measurement carried out is a measurement by truly correlated double sampling in the sense that the converted value is the difference between a potential sample taken just after storage node resetting and a subsequent potential sample taken after charges have been discharged from the amplifying structure into the storage node.

When viewing with a low luminance level, a large number N of alternating potentials will be applied. When viewing with a moderate luminance level, a lower number will be applied. When viewing with a high luminance level, no alternations of opposed potentials will be applied to the gates GA and GB.

For a highly contrasted image (very lightly illuminated pixels and highly illuminated pixels in the same image), two different multiplication factors k1 and k2 may be used in two different successive frames FR1 and FR2 and the frame that gives the most appropriate measurement is selected for each pixel. Therefore there has to be two frames in order to obtain a complete image. The integration time may also be different in the two frames: a time Ti1 in the odd frames and a time Ti2 in the even frames. Preferably, the shorter time, for example Ti1, corresponds to the frame having the lower amplification factor, for example k1.

It is necessary for the numerical value established by the analogue-digital converter for a pixel measured with the lower factor to be multiplied by the ratio k2/k1, that is to say the ratio of the higher factor to the lower factor, so as to refer the measurements made under different conditions to the same scale. It is also necessary for the value measured with the shorter integration time (for example Ti1) to be multiplied by the ratio Ti2/Ti1.

One drawback of using two frames with two different amplification factors, whether with identical integration times or different integration times, is the fact that two frames are required to form a single image, thereby slowing down the image delivery rate.

In another operating mode for fast dynamics, only one frame is used, with an integration time which is divided into two parts: each part involves an electron integration and an amplification of the number of electrons, the amplification factors being different in the two parts. The integration times of the two parts may be the same or different. The lower amplification factor and the shorter time are preferably used for the first integration time.

Figure 6:
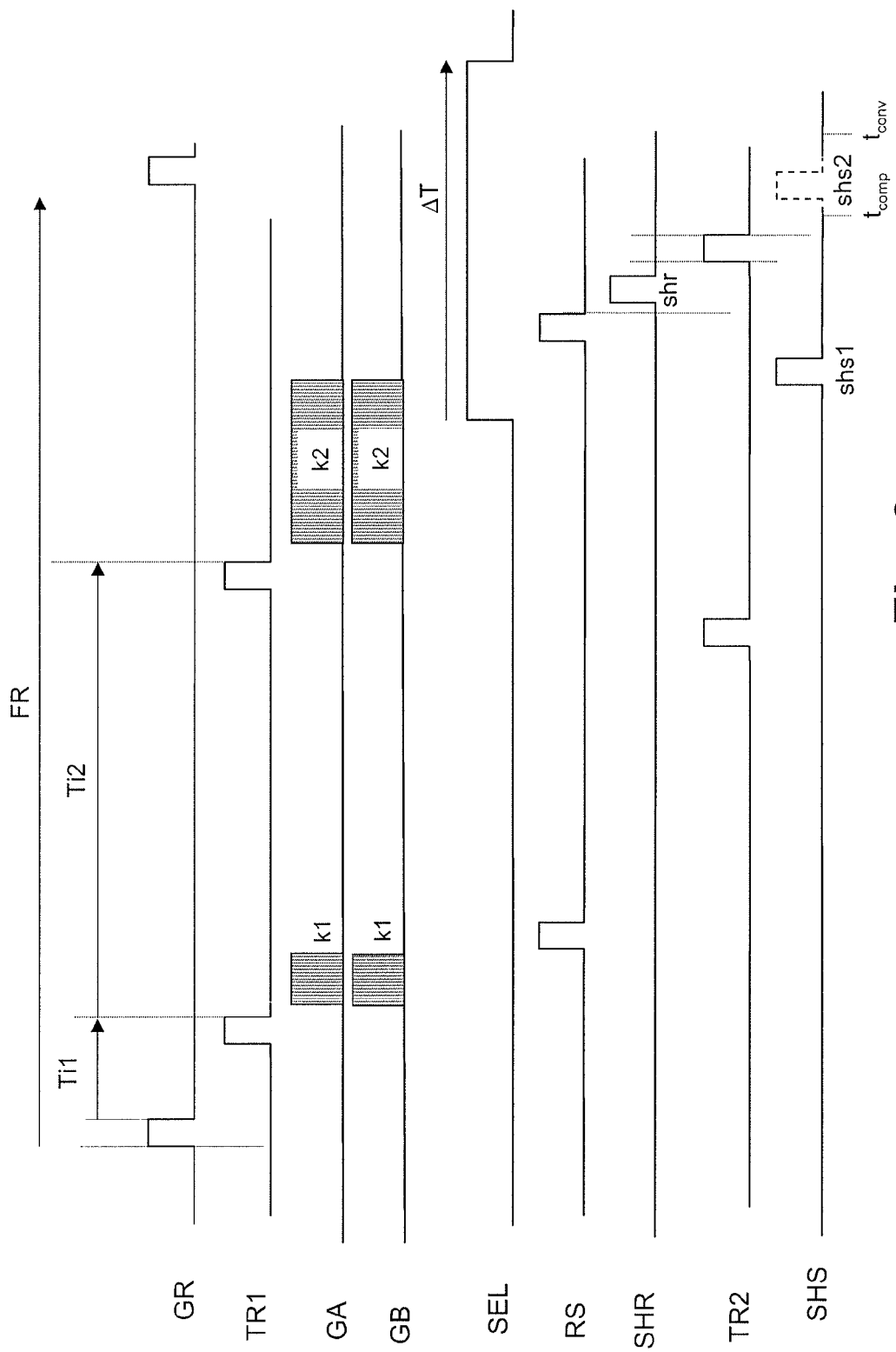
FIG. 6 shows a timing diagram for the operation of the sensor with both a low level and a high level of luminance.

The operation with two integration times for each row, as illustrated by FIG. 6 (a single frame FR is indicated since only one frame is used to collect a complete image, only the signals corresponding to a row of pixels being shown so as not to clutter the figure) is as follows:

resetting of the photodiode by a signal GR for the row in question, in order to start an integration period for this row;

charge integration in the photodiode;

opening of the first transfer gate TR1, emptying the charges from the photodiode into the amplifying structure at the end of a first, preferably short, integration time Ti1, that is to say a time shorter or much shorter than one half of the total integration time of a frame, the photodiode recommencing charge integration as soon as the gate closes;

first amplification with a first, low amplification factor k1 or a factor of unity (no amplification);

resetting of the storage node potential by a signal RS;

brief opening of the second transfer gate TR2 in order to transfer the charges amplified by the factor k1 to the storage node and reclosure of this gate;

opening of the first transfer gate TR1, defining the end of a second integration time Ti2, the sum of the times Ti1 and Ti2 constituting the total integration time of the frame, the charges corresponding to the second time passing into the amplifying structure and being amplified by a second amplification factor k2;

at the end of the second amplification and before the amplified charges are transferred to the storage node via the gate TR2, the following steps are carried out in order: a first sampling, by the signal shs1, in the read circuit, of the storage node level which, at this moment, corresponds to the first integration, amplified by the factor k1; then a resetting of the storage node (RS); and then a second sampling, in the read circuit, of the resetting level (shr); and finally, opening of the second transfer gate TR2, and therefore transfer of the charges to the storage node, during the second integration time, which charges are amplified by the second amplification factor; finally, a third sampling, but this is conditional and not systematic, shs2 of the storage node level, the third sampling, if this occurs, replacing the first sampling.

The third sampling is not carried out if the illumination measured by the pixel, either after the first integration time or after the second integration time, exceeds a threshold showing that there is a risk of saturating the measurement chain.

If the third sampling is not carried out, the difference between the first sample and the second sample is then digitized. This amounts to retaining the result of only the first integration.

Otherwise, if the third sampling is carried out (no risk of saturation), the third sample substitutes for the first. The difference between the third and second samples is then digitized, which amounts to measuring the result of the integration during the second period only. This difference is a true correlated double-sampling measurement, unlike the digitization of the difference between the first two samples.

The numerical value obtained in the first case (no third sampling) is multiplied by a factor, namely the ratio $(k2 \times Ti2)/(k1 \times Ti1)$ so as to be referenced with respect to the same scale as in the second case (with third sampling).

To carry out a conditional third sampling, the storage node potential level may be tested at the end of the second measurement, at a time $t_{comp}$ just before the moment of the conditional third sampling, or the storage node potential level may be tested at the end of the first measurement.

The read circuit includes a test circuit for this purpose, the action of which is to permit or prevent the generation of the signal shs2. This circuit also stores the result of the test, which result is used to decide whether or not the result of the differential measurement has to be multiplied by the multiplicative factor $(k2 \times Ti2/k1 \times Ti1)$.

All the signals shown in FIG. 6 for a row have to be repeated in the same way, but shifted by a time ΔT, for the next row, and so on (what is called "rolling shutter" operation). The time ΔT is the time needed to take the three samples and to carry out the analogue-digital conversion of the sample differences.

It should be noted that the amplification time over which the gates GA and GB amplify must be limited to the difference between the duration of an integration period and the time needed to read all the rows, since the latter are read in succession. For example, if the integration time is 15 milliseconds and the time needed for reading is about 5 milliseconds (5 microseconds per row for 1024 rows for example), the amplification time must be limited to 10 milliseconds.

The conditional sampling test is carried out in the read circuit. In one example, a threshold comparator compares the storage node potential level (present on the column conductor) just after the second transfer via the gate TR2 and permits or precludes the third sampling. In another example, notably applicable when the first integration time Ti1 is the shorter one, the analogue-digital converter is a ramp converter, which effects a rapid provisional conversion on the result of the first sampling; depending on the result of this rapid provisional conversion, the conditional sampling is permitted or not, and in all cases the converter restarts a definitive conversion. The provisional conversion may consist in observing the output of an input comparator of the converter. The comparator receives, on its two inputs, the useful signal and reset level samples. A short linear voltage ramp of predefined duration is applied to the useful signal input and added to the useful signal. The comparator switches whenever the differential voltage between its inputs become zero. The comparator switches before the end of the ramp if the illumination is low, but does not switch if the illumination is high.

If three sampling capacitors are used in the read circuit instead of two, a systematic (unconditional) sampling shs2 may be performed. A reset level, a measurement level corresponding to the first integration time with the first factor, and a measurement level corresponding to the second time are stored in the three capacitors, respectively. An analogue/digital conversion of the difference between the voltages in the second and first capacitors, or else the conversion of the difference between the voltages in the third and second capacitors, is then performed. The converted value may then be a value resulting from a true correlated double sampling provided that, for each row, the operations in the following order are performed;

resetting of the storage node level;

sampling of this level in the first capacitor;

transfer of the result of the first integration (amplified by the amplifying structure) to the storage node and then transfer from the photodiode to the amplifying structure at the end of the second integration time Ti2;

sampling of the storage node level in the second capacitor;

transfer of the result of the second amplified integration to the storage node with no prior resetting of the latter; and sampling of the level in the third capacitor.

In this operating mode, in the same way as previously, there is an illumination level condition for selecting the conversion that has to be performed. The condition is the same as previously—it acts not on the authorization for a sampling shs2 but on the choice of samples (first or third) which will be used for the conversion.

Finally, in one embodiment, provision is made for the gates GA of the pixels of a given row to be controlled by a row conductor and the gates GB of the pixels of a given column to be controlled by a column conductor. The amplification by alternations of potentials takes place only if both the gates GA and the gates GB receive a periodic alternation of potentials. Means may be provided for selecting only some of the rows of pixels, to apply an alternation of potentials to their gates GA and means for selecting only some of the columns of pixels to apply another alternation of potentials to their gates GB, the two alternations combining to create an alternation of electric fields of opposite sign. In this case, only the pixels at the intersections of these rows and columns will undergo amplification by electron multiplication in these pixels. It is therefore possible to select a region of interest in the image, notably a dark region, to apply to said region an amplification by electron multiplication without applying it to the other regions.

The possibilities afforded by this selection of a region of interest may be combined with the possibilities afforded by the selection of two different multiplication factors for one and the same image acquisition, these two factors being able to be applied in the same region of interest.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An image sensor having active-pixels formed in a semiconductor substrate, each active-pixel comprising, at the surface of a semiconductor active layer, a photodiode region, a charge storage node, a read transistor for reading the charges stored in the storage node, a reset transistor for resetting the potential of the storage node, and a transfer structure for transferring charges from the photodiode region to the storage node after a charge integration time for charges generated by light in the photodiode region, wherein the transfer structure comprises:

a first transfer gate adjacent to the photodiode region,
a second transfer gate adjacent to the storage node,
an amplifying structure located between the first and second transfer gates and comprising two separate accelerating gates,
an intermediate diode region at a fixed surface potential, located between the two accelerating gates, means for firstly applying to the first transfer gate a first transfer pulse for charge transfer from the first transfer gate to at least one first accelerating gate, means for then applying to the accelerating gates a succession of alternating high and low potentials for successive charge transfer from one accelerating gate to the other through the intermediate diode region, and means for then applying to the second transfer gate a second transfer pulse for charge transfer from the accelerating gates to the storage node.

2. A sensor according to claim 1, wherein the intermediate diode region is a pinned diode having a fixed surface potential with respect to a reference potential, and wherein the alternating high and low potentials are a high potential and a low potential such that the potential beneath a gate alternates between a higher level and a lower level than the fixed surface potential.

3. A sensor according to claim 2, wherein the semiconductor substrate includes a p-type semiconductor active layer which is maintained at the reference potential, and the intermediate diode includes an N-type diffused region in said layer, this region being covered by a P-type surface region connected to the potential of the active layer.

4. A sensor according to claim 1, comprising means for applying a different amplification factor during even frames and odd frames.

5. A sensor according to claim 2, comprising means for applying a different amplification factor during even frames and odd frames.

6. A sensor according to claim 3, comprising means for applying a different amplification factor during even frames and odd frames.

7. A sensor according to claim 1, further including means for carrying out in succession over the course of one frame a measurement for a first integration time and a measurement for a second integration time, and means for selecting one of the two measurements according to a potential level on the storage node after an amplification of charges integrated during the first integration time or after an amplification of charges integrated during the second integration time.

8. A sensor according to claim 2, further including means for carrying out in succession over the course of one frame a measurement for a first integration time and a measurement for a second integration time, and means for selecting one of the two measurements according to a potential level on the storage node after an amplification of charges integrated during the first integration time or after an amplification of charges integrated during the second integration time.

9. A sensor according to claim 3, further including means for carrying out in succession over the course of one frame a measurement for a first integration time and a measurement for a second integration time, and means for selecting one of the two measurements according to a potential level on the storage node after an amplification of charges integrated during the first integration time or after an amplification of charges integrated during the second integration time.

* * * * *